United States Patent [19]
Keenan

[11] Patent Number: 5,103,314
[45] Date of Patent: Apr. 7, 1992

[54] COLOR-CODED SYSTEM FOR SELECTION OF RF INPUT TERMINALS AND ASSOCIATED SCAN LISTS

[75] Inventor: Douglas M. Keenan, Noblesville, Ind.

[73] Assignee: Thomson Consumer Electronics, Inc., Indianapolis, Ind.

[21] Appl. No.: 589,832

[22] Filed: Sep. 24, 1990

[51] Int. Cl.$^5$ .............................................. H04N 5/50
[52] U.S. Cl. ........................... 358/193.1; 358/194.1; 455/151.1; 455/160.1; 455/161.2; 455/185.1
[58] Field of Search ............... 358/191.1, 194.1, 193.1; 455/150, 151, 160, 161, 179, 185, 186, 140, 166, 168, 176

[56] References Cited

U.S. PATENT DOCUMENTS

| | | | |
|---|---|---|---|
| 4,063,179 | 12/1977 | Brown | 455/166 |
| 4,075,567 | 2/1978 | Klank et al. | 455/186 |
| 4,291,413 | 9/1981 | Henderson et al. | 455/185 |
| 4,317,225 | 2/1982 | Henderson et al. | 358/193.1 |
| 4,317,227 | 2/1982 | Skerlos | 455/168 |
| 4,348,771 | 9/1982 | Klank et al. | 455/185 |
| 4,361,907 | 11/1982 | Wine | 455/166 |
| 4,398,303 | 8/1983 | Chin et al. | 455/168 |
| 4,737,993 | 4/1988 | DeVilbiss | 358/191.1 |
| 4,776,038 | 10/1988 | Testin et al. | 358/193.1 |
| 4,841,368 | 6/1989 | Rumbolt et al. | 358/194.1 |
| 4,888,819 | 12/1989 | Oda et al. | 358/191.1 |
| 5,048,119 | 9/1991 | Wassink | 455/186 |

Primary Examiner—James J. Groody
Assistant Examiner—Jeffrey S. Murrell
Attorney, Agent, or Firm—Joseph S. Tripoli; Peter M. Emanuel; Thomas F. Lenihan

[57] ABSTRACT

In a television receiver including a plurality of RF input terminals, each of which having a respective scan list, the channel numbers of respective scan lists are displayed in respective colors to indicate to the viewer which RF input terminal and associated scan list is selected. In one embodiment of the invention, the RF input terminals and the antenna selection keys of a user-operable keyboard are color-coded to correspond to the color-coded channel numbers.

8 Claims, 10 Drawing Sheets

COLOR-CODED SYSTEM FOR SELECTION OF RF INPUT TERMINALS AND ASSOCIATED SCAN LISTS

CROSS REFERENCE TO A RELATED APPLICATION

The subject application is related to copending U.S. patent applications, filed herewith, bearing Ser. Nos. 589,830 and 589,831, and assigned to the same assignee as the present invention.

FIELD OF THE INVENTION

The subject application concerns the field of television receivers having memory circuitry for storing lists of preferred television channels, and in particular, for storing multiple lists, wherein each list relates to a respective one of a plurality of RF signal sources.

BACKGROUND OF THE INVENTION

Numerous radio frequency (RF) signal sources are currently available for supplying television signals to a user's television receiver. These RF signal sources include, an ultra-high frequency (UHF) antenna, a very-high frequency (VHF) antenna, video games, home computers, cable television systems, videocassette recorders, videodisc players, and TVRO (television receive-only) satellite television receivers.

Many modern television receivers are equipped with multiple RF signal input connectors, and have the capability of receiving video signals from two different RF signal sources. A television receiver with two RF signal input terminals eliminates repeated plugging-in and unplugging of cables which would otherwise be necessary when changing from one signal source to another.

Systems which allow a user to enter a list of preferred channels (i.e., a scan list) of those channels which are receivable via an RF input terminal, are known. Such scan lists include information as to whether or not the desired channel is an "AIR" channel or a "CABLE" channel, information concerning the tuning voltage required to tune the channel, and information indicating in which band of frequencies the desired channel resides. With such a system, a user can program into the scan list only those channels which are of interest to him, thereby causing the "skipping" of unused, or undesired channels when changing channels via a "channel up", or "channel down" command. Scanning down beyond the last channel stored in the scan list causes the tuning of the first channel in the scan list. Similarly, scanning up beyond the first channel stored in the scan list causes the tuning of the last channel in the scan list. This method of operation is known as "wrapping around" from top to bottom or, bottom to top. Inclusion of a scan list feature in a television receiver having multiple RF input terminals is known from the RCA CTC-133 color television receiver, manufactured by Thomson Consumer Electronics, Inc., Indianapolis, Ind. In this receiver, each RF input terminal has a separate scan list associated with it.

It is common practice for cable television services to remodulate television signals transmitted on given "air" channels, onto different cable channels. For example, the signals of channel 29 may be remodulated on a cable system and appear on cable channel 8. Therefore, with a separate scan list arrangement, the same channels may appear in more than one scan list. Using the previous example, assume RF input terminal A is connected to an external antenna, and RF input terminal B is connected to a cable converter unit. In this arrangement, the signals from a given broadcaster (channel 29) will appear on channel 29 on RF input terminal A., and the same signals will appear on RF input terminal B, on cable channel 8. There are two reasons for wanting to eliminate the above-noted duplication of channels. First, the duplication of channels may be annoying to a user who is scanning through the available channels in both scan lists in sequence. Second, the memory space available for the scan lists is limited, and such duplication is wasteful, especially in light of the fact that a receiver coupled to both cable and satellite systems may have over 100 television channels available for viewing.

A user who deletes an otherwise duplicated channel from one of the scan lists must either remember in which scan list it is to be found, or search through the channels of both scan lists. Searching through the scan lists requires that the user scan through the channels by use of the "channel up" or "channel down" keys until the above-mentioned "wrap-around" of the scan list occurs. This ensures that the user has seen all of the channels of a first scan list before selecting another RF input and scanning through its related scan list for the desired channel. Unfortunately, this method of operation also causes the viewer to see at least one of the channels of the first scan list, a second time in order to be sure that he has indeed seen all of the channels in the first list.

Copending U.S. patent application Ser. No. 589,830 (Keenan) discloses a solution to the above noted problems in that the scan lists associated with each RF input terminal are capable of being linked together so that a user may scan through all channels on all scan lists in sequence, with the proper RF input terminal being automatically selected when the system automatically advances from one scan list to another. It is desirable that the user be informed of which scan list (i.e., which RF input terminal) is currently selected. The above-mentioned RCA CTC-133 color television chassis provides an on-screen display including channel number, and a message A1, A2, or A3 to indicate which RF input terminal is selected. It is felt, however, that such a two line display may be objectionable to some viewers who may feel that it clutters the display screen.

SUMMARY OF THE INVENTION

In a television receiver including a plurality of RF input terminals, each of which having a respective scan list, the channel numbers of respective scan lists are displayed in respective colors to indicate to the viewer which RF input terminal and associated scan list is selected. In one embodiment of the invention, the RF input terminals and the antenna selection keys of a user-operable keyboard are color-coded to correspond to the color-coded channel numbers.

DETAILED DESCRIPTION OF THE EMBODIMENT

Figure 1:
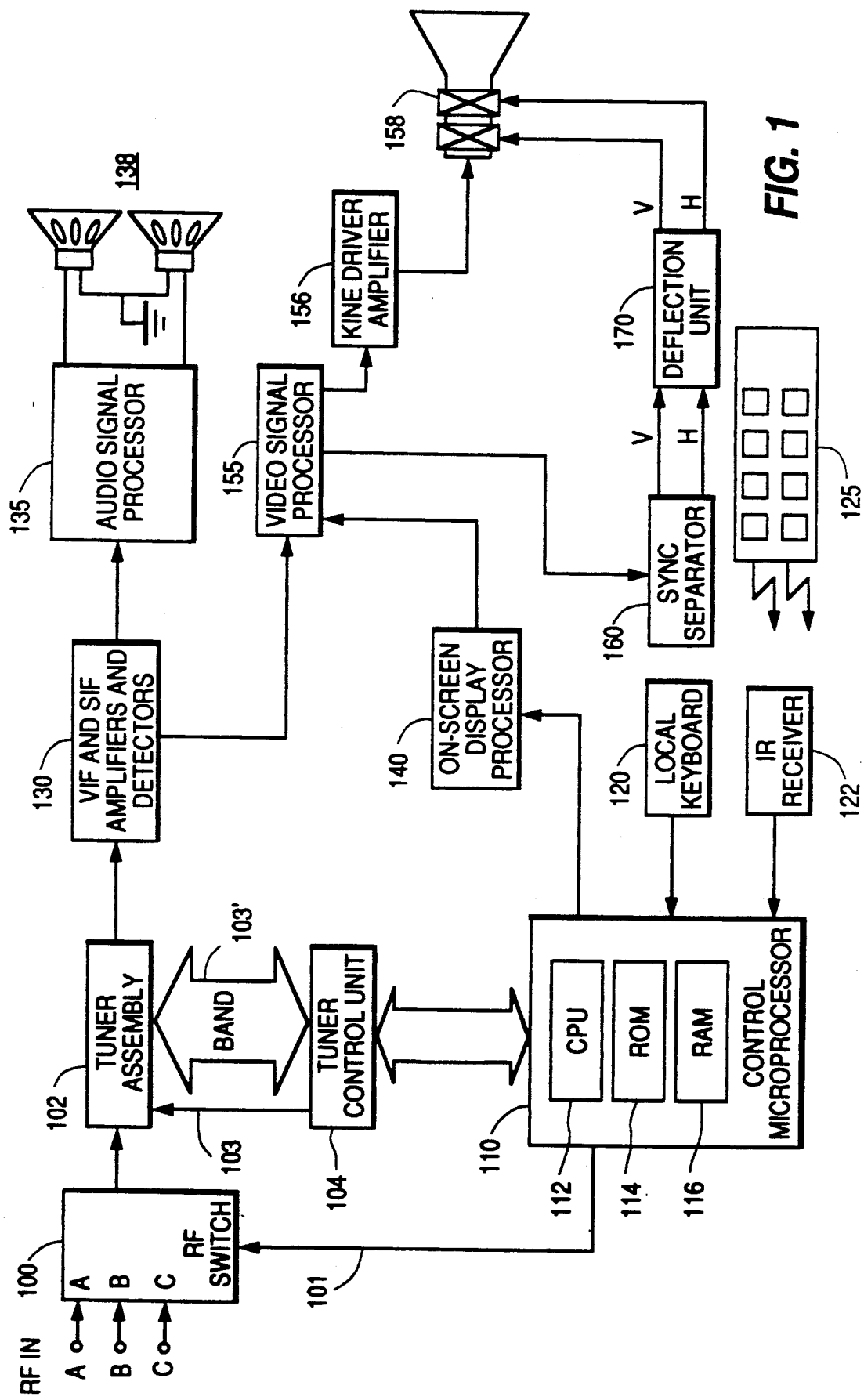
FIG. 1 shows, in block diagram form, a television receiver incorporating the subject invention.

Referring to FIG. 1, radio frequency (RF) signals are applied to RF input terminals A, B, and C of RF switch 100. Under control of a control signal applied via wire 101, RF switch 100 selects one of inputs A, B, and C to supply one or more RF signals to a tuner assembly 102. Tuner assembly 102 selects a particular RF signal under control of a tuner control unit 104 which applies a tuning control signal to tuner assembly 102 via a wire 103, and applies bandswitching signals via a control bus 103'. Tuner control unit 104 is controlled by a controller 110. Controller 110, which may be a microprocessor or microcomputer, includes a central processing unit (CPU) 112, a read-only memory (ROM) 114, and a random access memory 116. Controller 110 generates the above-mentioned control signal for RF switch 100 for selecting an RF input for tuner 102. Controller 110 receives user-entered control signals from a local keyboard 120 and from an infrared (IR) receiver 122. IR receiver 122 receives and decodes remote control signals transmitted by a remote control unit 125.

Tuner 102 produces a signal at an intermediate frequency (IF) and applies it to a processing unit 130 comprising a video IF (VIF) amplifying stage, an AFT circuit, a video detector, and a sound IF (SIF) amplifying stage. Processing unit 130 produces a baseband composite video signal (TV), and a sound carrier signal. The sound carrier signal is applied to an audio signal processor unit 135 which includes an audio detector and a stereo decoder. Audio signal processor unit 135 produces baseband left and right audio signals and applies them a pair of speakers 138 for sound reproduction.

The baseband video signal (TV) is coupled to a video processor unit 155 and a kine driver amplifier 156, and ultimately displayed on a display screen of a display device 158. Video signals are also applied to a sync separator unit 160 which derives vertical and horizontal synchronizing signals therefrom. The derived vertical and horizontal signals are applied to a deflection unit 170 for the production of deflection signals for application to the yoke assembly of display device 158. Under control of controller 110, an on-screen display processor 140 generates character signals, and applies them to a second input of video signal processor 155, for display on display device 158. The circuitry described thus far is known from the above-mentioned RCA CTC-133 color television chassis.

Figure 2:
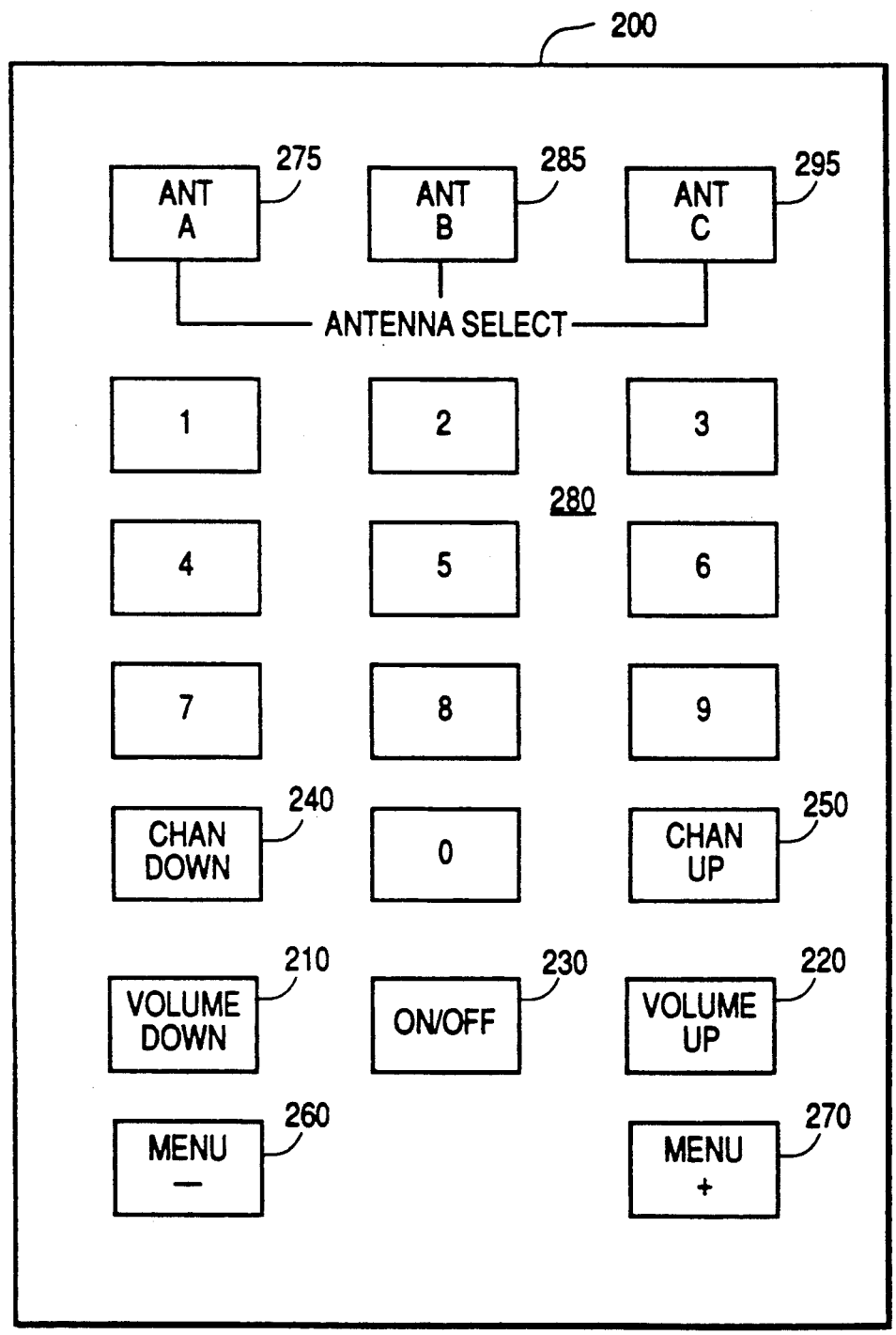
FIGS. 2 and 2A show keyboards suitable for use with the remote control handunit of FIG. 1

Turning to FIG. 2, a keyboard 200 suitable for use on remote control unit 125 of FIG. 1, includes a VOLUME DOWN key 210, a VOLUME UP key 220, an ON/OFF key 230, a CHANNEL DOWN key 240, a CHANNEL UP key 250, a MENU−key 260, a MENU+key 270, an array of numbered keys generally designated 280, and a group of ANTENNA SELECT keys 275, 285, and 295. Specific use of keys of keyboard 200 will be described in detail below.

Figure 3:
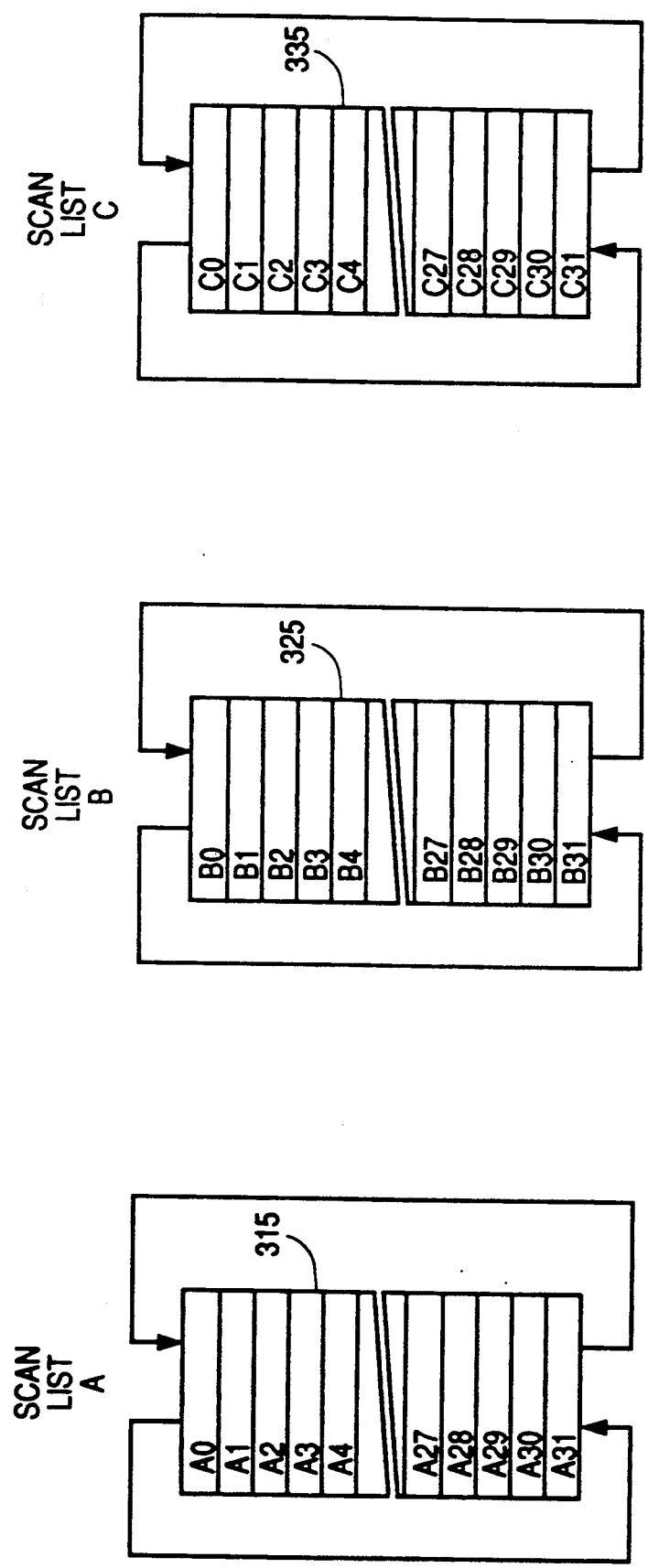
FIG. 3 shows an arrangement of memory locations for storing scan lists, as known from the prior art.

As noted above, the RCA CTC-133 color television chassis includes three RF input connectors, each having a respective scan list associated with it. For purposes of explanation, these scan lists can be thought of as being arranged in memory (i.e., RAM 116) as shown in FIG. 3. Each scan list is independent of the others. Each scan lists has its own pointer, which upon reaching the bottom of the scan list while scanning down, "wraps around" to the top, and which upon reaching the top of the scan list while scanning up, "wraps around" to the bottom. For simplicity, scan lists 315, 325, and 335 are shown as including 32 (i.e., A0–A31) memory locations each. Also for simplicity, the "wrap around" arrows are shown extending between locations A0 and A31. In fact, a scan list having only three locations filled would "wrap around" between location A2 (i.e., the third location in the list) and location A0. That is, the logical end of the scan list is not necessarily the same memory location as the physical end of the scan list. Note that in the prior art system of FIG. 3, a user must first select the scan list containing the desired channel information, and then conduct a search for the desired channel. A problem occurs in this system when the user cannot remember which scan list is the proper one to select for searching.

Figure 4:
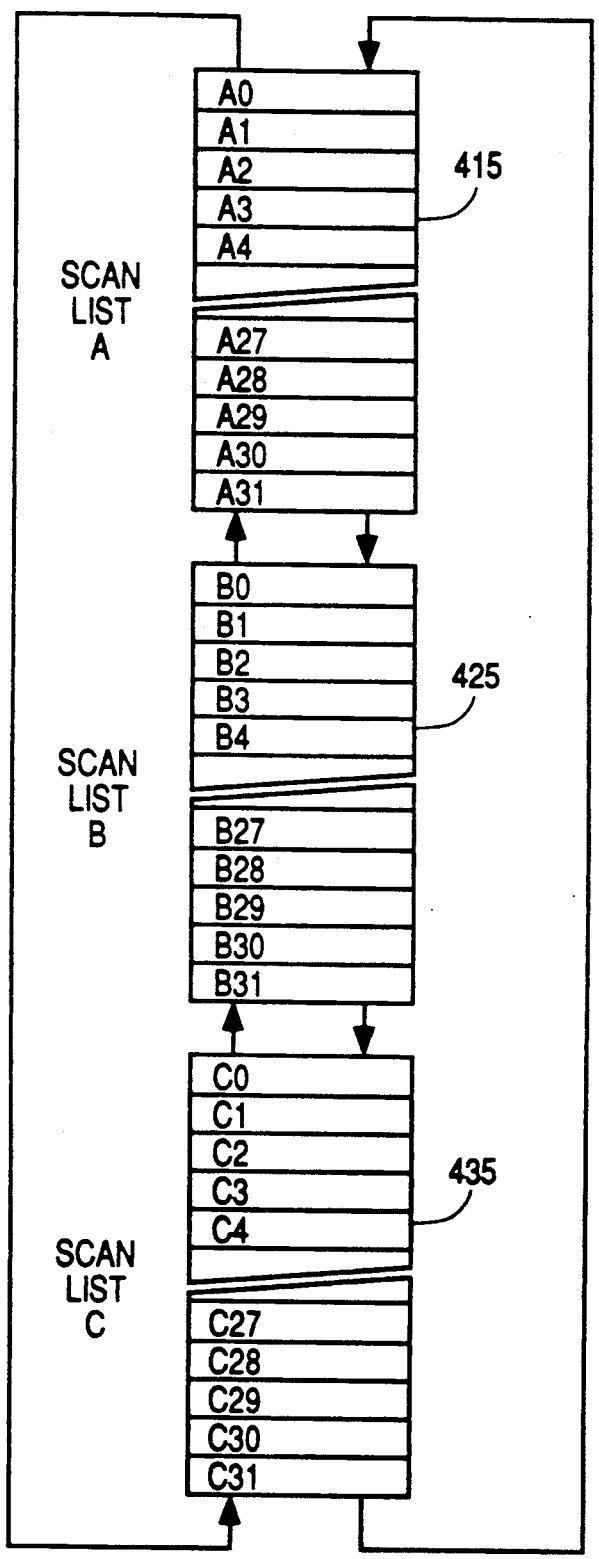
FIG. 4 shows an arrangement of memory locations for storing scan lists, in accordance with the subject invention.

The scan lists of the present invention can be arranged as shown in FIG. 3, or rearranged as shown in FIG. 4, by means of a user-entered command. Each scan list of FIG. 4 is linked with the others. The linked scan list has its own pointer, which upon reaching the bottom of the linked scan list while scanning down, "wraps around" to the top, and which upon reaching. the top of the linked scan list while scanning up, "wraps around" to the bottom. As noted above, for simplicity, scan lists 415, 425, and 435 are shown as including 32 (i.e., A0–A31) memory locations each. Also for simplicity, the "wrap around" arrows are shown extending between locations A0 and A31. As was true in FIG. 3, a scan list having only three locations filled would "wrap around" between location A2 (i.e., the third location in the list) and location A0. That is, the logical end of the scan list is not necessarily the same memory location as the physical end of the scan list. Note that unlike the prior art system of FIG. 3, a user can scan through all three lists in sequence automatically to find a desired channel. Note that the act of switching from one list to another also causes the selection of a new RF input connector, because each scan list, even though linked, remains associated with a respective RF input connector. Similarly, the act of selecting a new RF input terminal by pressing one of ANTENNA SELECT keys 275, 285 or 295, also selects the appropriate scan list for that RF terminal.

Figure 5:
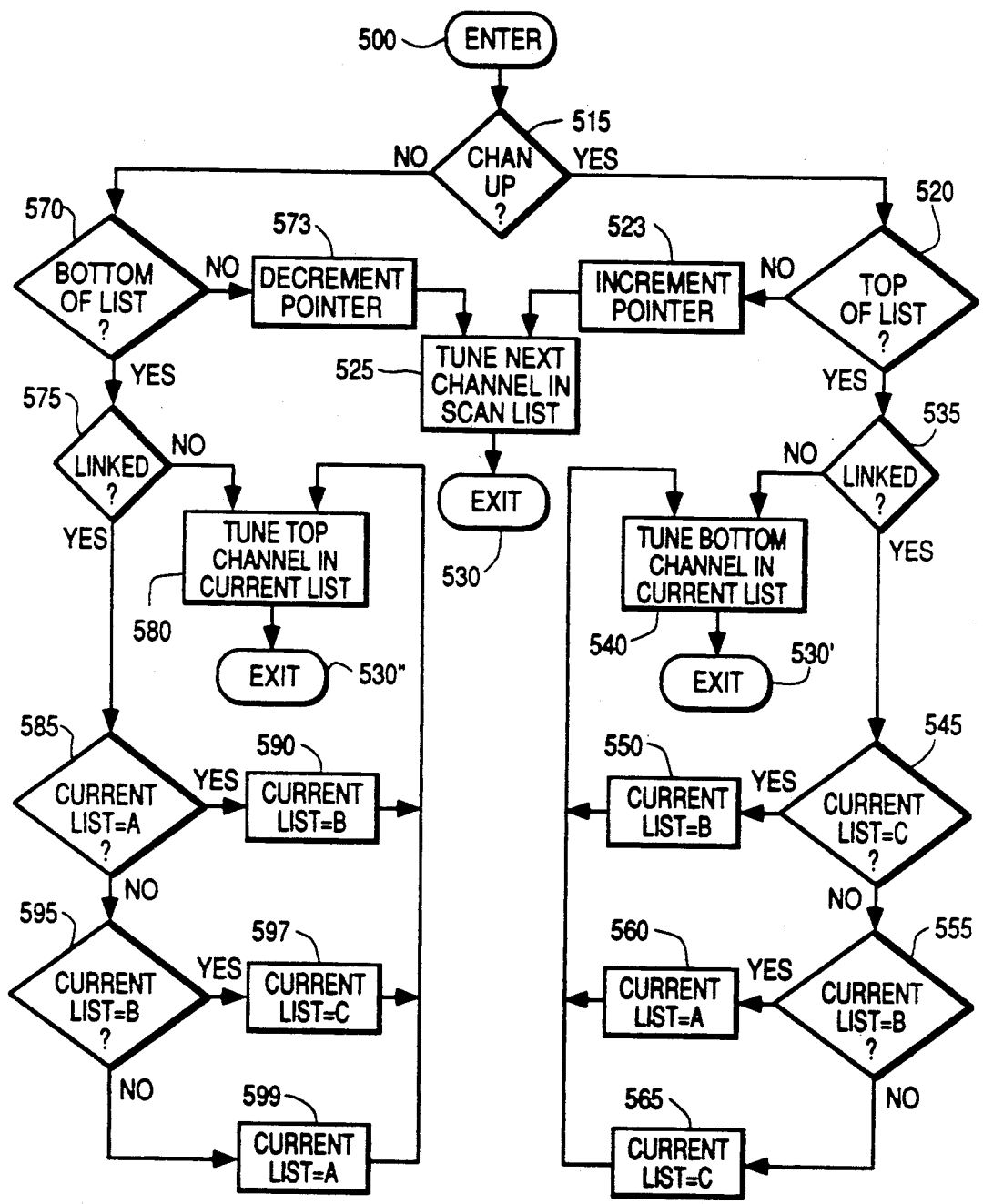
FIG. 5 is a flowchart showing a portion of the control program of the controller of FIG. 1.

A portion of the control program for controller 110, for controlling a channel scanning operation, is illustrated in the flowchart of FIG. 5. For purposes of this explanation, it is assumed that the desired channel information has previously been programmed into the scan lists, in the usual manner. The program is entered at step 500 upon reception of a keyboard, or remote control, CHANNEL UP or CHANNEL DOWN command. At step 515, a decision is made as to whether or not the received command is a CHANNEL UP command. If the command is a CHANNEL UP command, then the program checks to see if the pointer is at the top of the currently-accessed scan list (step 520). If not, then the pointer is incremented to get the information for tuning the next channel in the scan list (steps 523 and 525), and the routine is exited at step 530. However, if the pointer was at the top of the scan list (520), then a check is made to see if the scan lists are linked, by reading a memory location which holds that information (step 535). If the lists are not linked, then they are arranged as shown in FIG. 3, and a wrap-around to the bottom of the currently-accessed scan list is desired. In that case, the NO path is followed to step 540 in which the pointer is pointed to the bottom of the list and information for tuning the last value in the list is read. The program is then exited at step 530'. However, if the lists are linked, the scan lists are arranged as shown in FIG. 4, and the tuning of the bottom value in an adjacent scan list is desired. In that case, the YES path is taken to step 545 where a determination is made as to whether or not the current list is Scan List C. If yes, then the current list is becomes Scan List B (step 550), and the bottom channel in that scan list is tuned (steps 540 and 530'). If the current list is not C, then a check is made to see if the current list is Scan List B (step 555). If yes, then the current list becomes Scan List A (step 560), and the bottom channel in that scan list is tuned (steps 540 and 530'). If the current scan list is not Scan List C or B, then it must be Scan List A. Thus the NO path is taken to step 565, wherein the current list becomes Scan List C, thereby causing a wrap-around from the top of Scan List A to the bottom of Scan List C. The bottom channel of Scan List C is then tuned (steps 540 and 530').

Returning to step 515, if the received command is not a CHANNEL UP command, then it must be a CHANNEL DOWN command. In that case, the NO path is taken to step 570 wherein a determination is made as to whether or not the pointer is pointing to the bottom entry in the currently-accessed scan list. If not, then the pointer is decremented to get the information for tuning the next channel in the scan list (steps 573 and 525), and the routine is exited at step 530. However, if the pointer was at the top of the scan list (step 570), then a check is made to see if the scan lists are linked, by reading a memory location which holds that information (step 575). If the lists are not linked, then they are arranged as shown in FIG. 3, and a wrap-around to the top of the currently-accessed scan list is desired. In that case, the NO path is followed to step 580 in which the pointer is pointed to the top of the current list and information for tuning the last value in the list is read. The program is then exited at step 530''. However, if the lists are linked, then the scan lists are arranged as shown in FIG. 4, and the tuning of the top value in an adjacent scan list is desired. In that case, the YES path is taken to step 585 where a determination is made as to whether or not the current list is Scan List A. If yes, then the current list is becomes Scan List B (step 590), and the bottom channel in that scan list is tuned (steps 580 and 530''). If the current list is not A, then a check is made to see if the current list is Scan List B (step 595). If yes, then the current list becomes Scan List C (step 597), and the bottom channel in that scan list is tuned (steps 580 and 530''). If the current scan list is not Scan List A or B, then it must be Scan List C. Thus the NO path is taken to step 599, wherein the current list becomes Scan List A, thereby causing a wrap-around from the bottom of Scan List C to the top of Scan List A. The top channel of Scan List A is then tuned (steps 580 and 530'').

Figure 6:
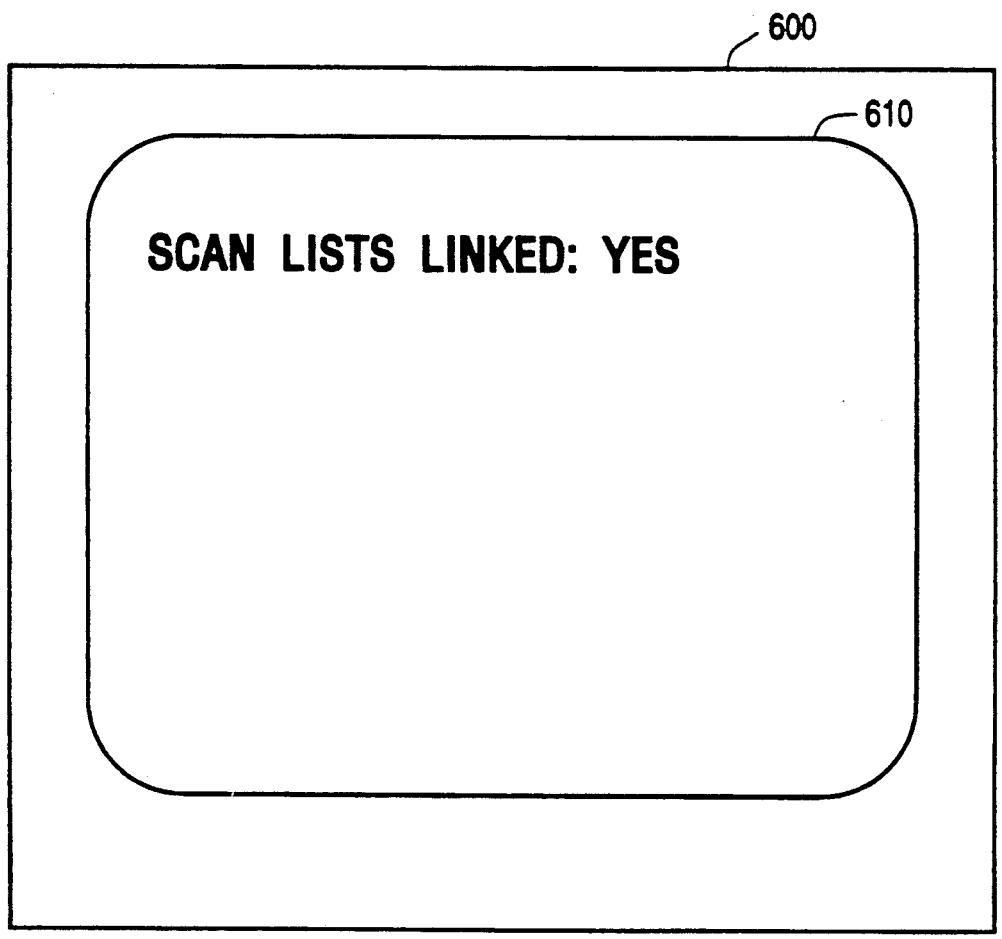
FIG. 6 is an illustration showing a display screen menu produced in accordance with the invention.

FIG. 6 shows a television receiver 600 having a display screen 610 displaying a portion of a menu indicating the linked state of the scan lists (i.e., either YES or NO). The scan lists are linkable and unlinkable at the command of the viewer under control of controller 110. Pressing the MENU+key 270 of keyboard 200 causes the scan lists to become linked, and the display of FIG. 6 to indicate YES. Pressing the MENU−key 260 of keyboard 200 causes the lists to be unlinked (i.e., to be separate), and causes the display of FIG. 6 to indicate NO.

Figure 7:
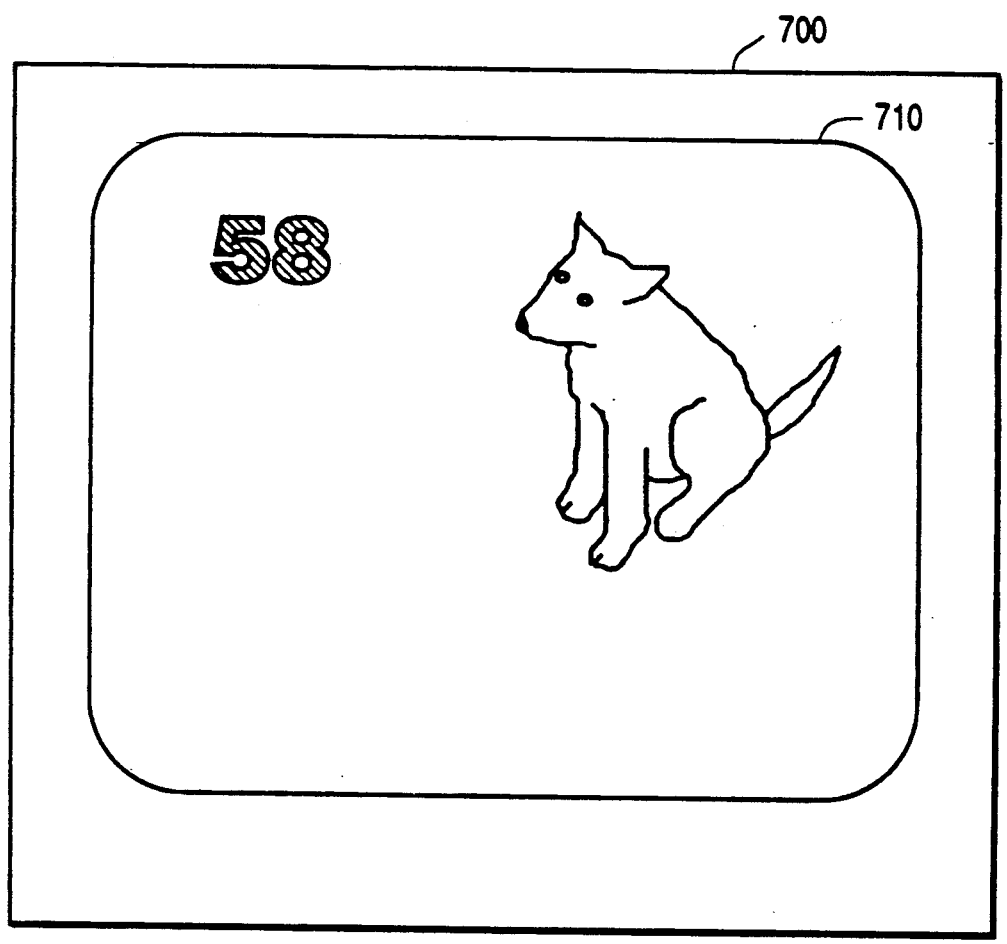
FIGS. 7 and 8 are illustrations showing screen displays having channel numbers displayed in different respective colors, in accordance with an aspect of the invention.
Figure 8:
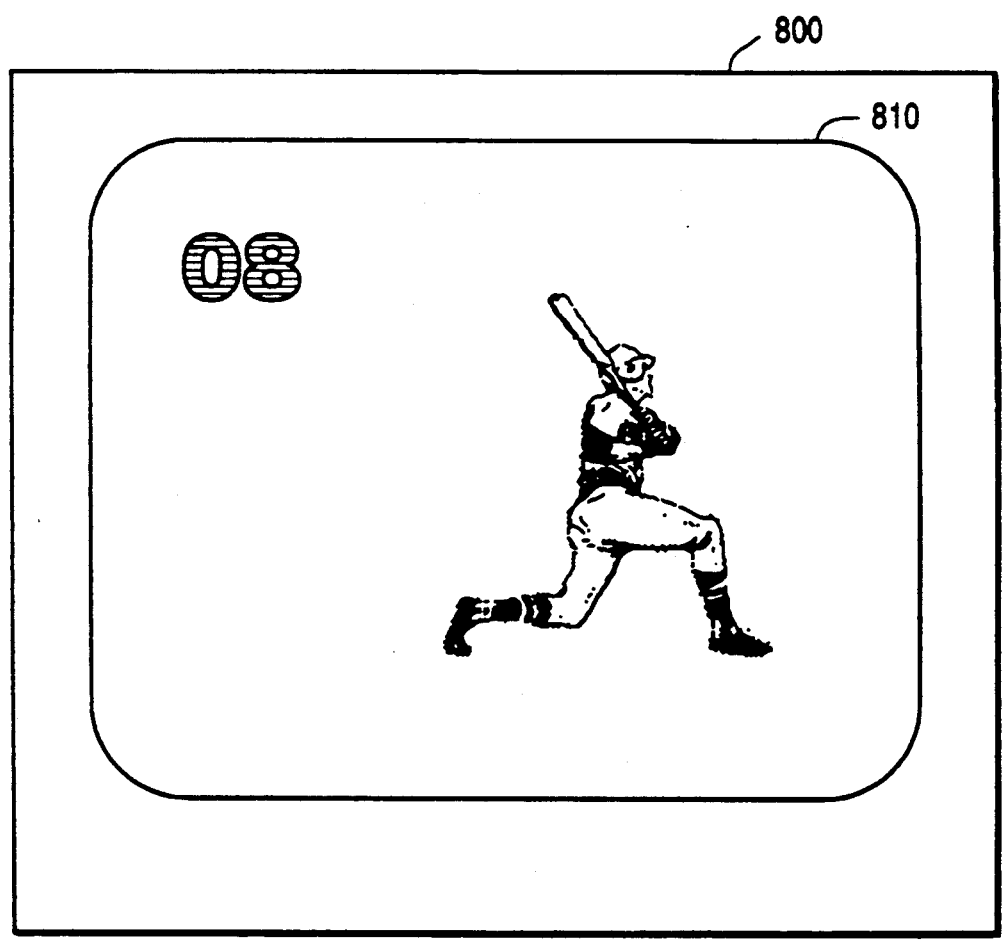

FIG. 7 and 8, taken together, shown the effect of scanning from the top of one scan list into the bottom of another (or vice-versa). FIG. 7 shows a television receiver 700 having a display screen 710 displaying a television program received on channel 58. For purposes of explanation, assume that the scan lists are linked, and that the tuning information for channel 58 is contained in the top address of a currently-accessed scan list, associated with a first RF input terminal. Assume also, that the tuning information for channel 08 is contained in the bottom location of an adjacent scan list, associated with a different RF input terminal. Pressing CHANNEL UP key 250 of keyboard 200 causes, as described above, the retrieval of the tuning information for the television channel stored in bottom memory location of an adjacent scan list, and the automatic selection of the corresponding RF input terminal. Thus, the result of pressing CHANNEL UP key 250, in the current example, is the display of a television program on channel 08, as shown in FIG. 18, supplied via a different RF input terminal than was the signal for previously-tuned channel 58.

Note that channel number 58 is shaded with diagonal lines to indicate the color green, and that channel number 08 is shaded with horizontal lines to indicate the color blue. It is desirable to inform the viewer as to which RF input terminal is the source of the currently-tuned channel. Previously, this was done by adding an on-screen message such as A1 or A2 (or ANT A or ANT B) to the channel number display. It is herein recognized that a uncluttered, simplified display of channel number can be provided by color-coding the channel number to indicate the particular RF input terminal in use. It is felt that an on-screen display of "green 58" (i.e., a green-colored channel 58 indication) is a channel number and RF input terminal display which is easier for the user to recognize and remember, than is an on-screen display of "58 A1".

Figure 9:
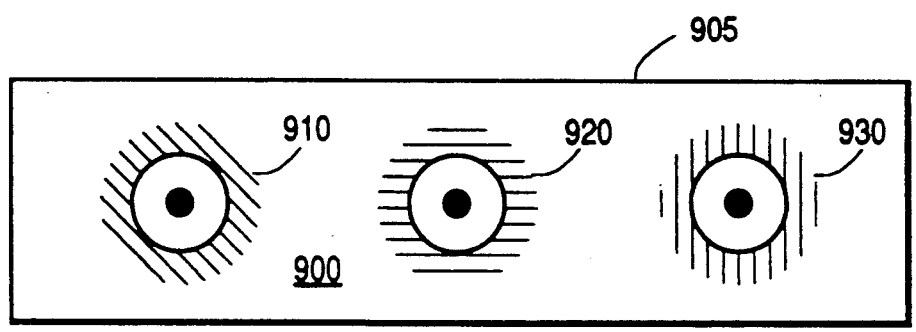
FIG. 9 shows an arrangement of RF input terminals according to one aspect of the invention.

It is further recognized that connection of RF sources to the television receiver can also be simplified (i.e., made less confusing) by color-coding the area surrounding the RF input terminals to match the colors produced in the channel number display when that RF input terminal is selected. That is, channel numbers displayed in blue are received via the RF input terminal surrounded by a blue color. Such an arrangement of terminals 900 is shown in FIG. 9, wherein a panel 905 includes an area 910 shaded with diagonal lines to indicate the color green, an area 920 shaded with horizontal lines to indicate the color blue, and an area 930 shaded with vertical lines to indicate the color red.

Figure 2A:
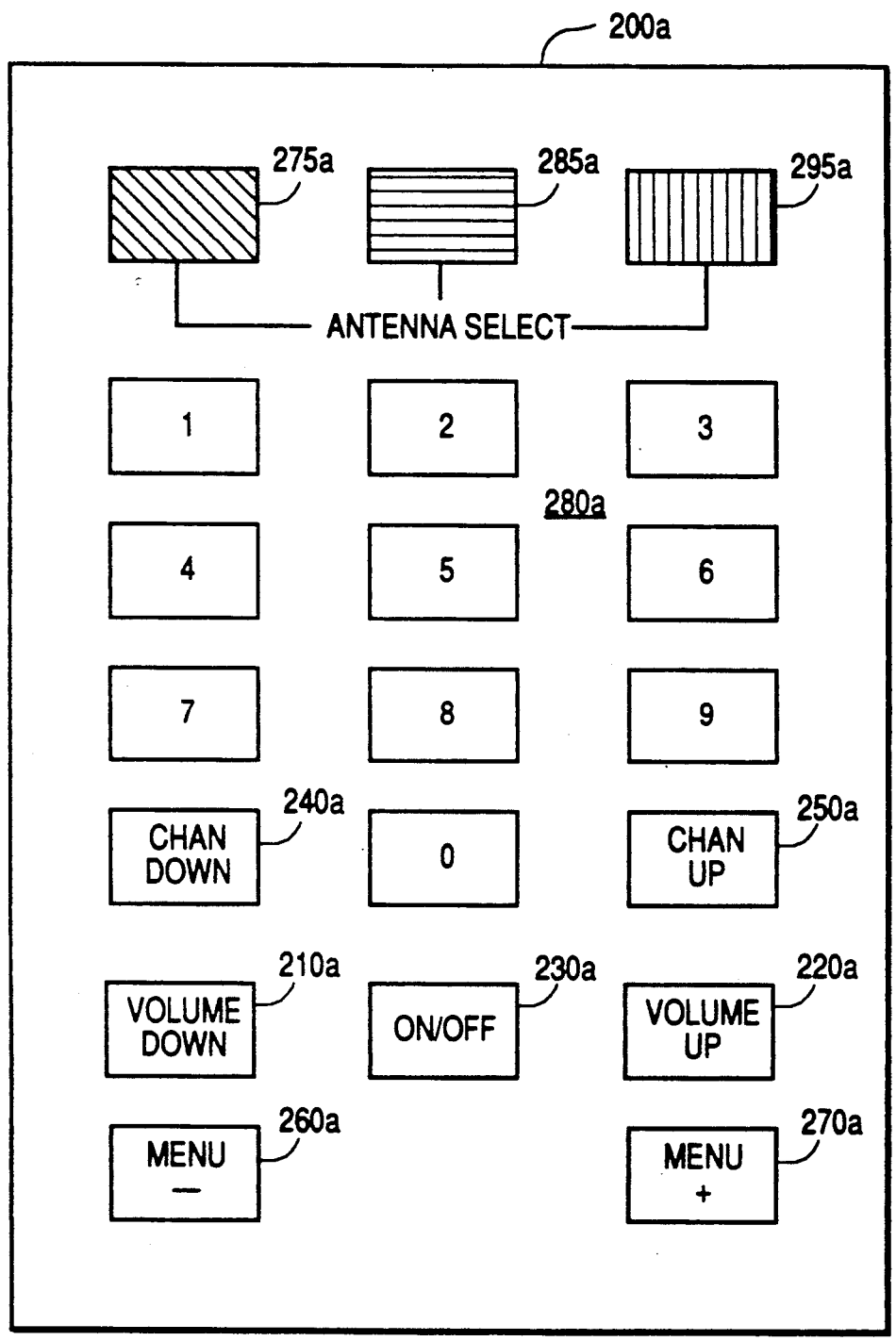

It is also herein recognized that in a system with color-coded RF input terminals and color-coded channel number displays, a clear indication of which inputs are available for selection is provided by color-coding the ANTENNA SELECT keys to correspond to the color-coded RF input terminals. Such an arrangement of color-coded keys is shown in FIG. 2A, wherein elements bearing similar reference numerals to elements of FIG. 2, serve a similar function. In FIG. 2A, key 275a is shaded with diagonal lines to indicate the color green, key 285a is shaded with horizontal lines to indicate the color blue, and key 295a is shaded with vertical lines to indicate the color red. It is felt that such a color-coded antenna selection system provides an easy to use system which reduces user confusion as to which video source is currently supplying signals to the television receiver.

The term television receiver, as used herein, includes television receivers having a display device (commonly known as television sets) and television receivers without a display device, such as VCRs.

What is claimed is:

1. A television receiver, comprising:
   a plurality of radio frequency (RF) signal input terminals, each of which receives a group of RF signals from respective RF signal sources;
   RF switch means having a plurality of inputs, each of which is connected to a respective one of said RF input terminals, said RF switch means having an output at which is developed one of said groups of RF signals selected from said groups of RF signals at said inputs, said RF input switch having a control input for receiving a first control signal for selecting said selected group of RF signals;
   tuner means coupled to said RF switch means for receiving said selected group of RF signals, said tuner means selecting a particular RF signal from said group of RF signals in response to a second control signal, and converting said particular RF signal to a signal at an intermediate frequency (IF);
   control means for generating said first and second control signals for causing said RF switch means to select one of said groups of RF signals and said tuner means to select said particular RF signal;
   means, coupled to said control means, for entering data in response to operation by a user;
   memory means having a plurality of areas for storing data related to the tuning of ones of said RF signals which are preferred by a user, each of said areas storing tuning information specific to the RF signals of a respective one of said groups of RF signals received at one of said RF input terminals;
   video processing means coupled to said tuner means for receiving, demodulating and amplifying said IF signal; and
   on-screen display means coupled to said control means and said video processor means for generating video signals indicative of characters for display;
   wherein in response to said data entered by said user, said control means sequentially retrieves said tuning data from said memory means in one of a linked mode in which said control means automatically retrieves said tuning data from a second one of said areas after having completed the sequential retrieval of said tuning data from said first area, and an unlinked mode in which said control means automatically begins the sequential retrieval of said tuning data from said first area upon completion of said sequential retrieval of said tuning data from said first area;
   said control means automatically generating said first control signal for selecting the respective one of said RF input terminals which is related to the memory area from which said tuning data is to be retrieved, said control means generating said second control signal in response to said retrieved tuning data;
   said on-screen display means generating said character signals in a first color when said first RF input terminal is selected, and in a second color when said second RF input terminal is selected.

2. A television receiver, comprising:
   a plurality of radio frequency L(RF) signal input terminals, each of which receives a group of RF signals from respective RF signal sources;
   RF switch means having a plurality of inputs, each of which is connected to a respective one of said RF input terminals, said RF switch means having an output at which is developed one of said groups of RF signals selected from said groups of RF signals at said inputs, said RF input switch having a control input for receiving a first control signal for selecting said selected group of RF signals;
   tuner means coupled to said RF switch means for receiving said selected group of RF signals, said tuner means selecting a particular RF signal from said group of RF signals in response to a second control signal, and converting said particular RF signal to a signal at an intermediate frequency (IF);
   control means for generating said first and second control signals for causing said RF switch means to select one of said group of RF signals and said tuner means to select said particular RF signal;
   means, coupled to said control means, for entering data in response to operation by a user;
   memory means having a plurality of areas for storing data related to the tuning of ones of said RF signals which are preferred by a user, each of said areas storing tuning information specific to the RF signals of a respective one of said groups of RF signals received t one of said RF input terminals;
   video processing means coupled to said tuner means for receiving, demodulating and amplifying said IF signal; and
   on-screen display means coupled to said control means and said video processor means for generating video signals indicative of characters for display;
   wherein in response to said data entered by said user, said control means sequentially retrieves said tuning data from said memory means in one of a linked mode in which said control means automatically retrieves said tuning data from a second one of said areas after having completed the sequential retrieval of said tuning data from said first area, and an unlinked mode in which said control means automatically begins the sequential retrieval of said tuning data from said first area upon completion of said sequential retrieval of said tuning data from said first area;
   said control means automatically generating said first control signal for selecting the respective one of said RF input terminals which is related to the memory area from which said tuning data is to be retrieved, said control means generating said second control signal in response to said retrieved tuning data;
   said on-screen display means generating said character signals in a first color when said first RF input terminal is selected, and in a second color when said second RF input terminal is selected;
   said means for entering data comprises a remote control unit, said remote control unit including keys for selecting individual ones of said RF input terminals, each of said keys for selecting said RF input terminals being distinguished from the others by a color associated with said key.

3. The television receiver of claim 2, wherein one of said RF input terminals is distinguished from the others by a color associated with said RF input terminal, and wherein said key for selecting a particular RF input terminal and said one RF input terminal are associated with the same color.

4. The television receiver of claim 3 wherein said one RF input terminal, said key for selecting said particular RF input terminal, and said character signals generated for display when said one RF input terminal is selected, are all associated with the same color.

5. A television receiver, comprising:
a plurality of radio frequency (RF) signal input terminals, each of which receives a group of RF signals from respective RF signal sources;
RF switch means having a plurality of inputs, each of which is connected to a respective one of said RF input terminals, said RF switch means having an output at which is developed one of said groups of RF signals selected from said groups of RF signals at said inputs, said RF input switch having a control input for receiving a first control signal for selecting said selected group of RF signals;
tuner means coupled to said RF switch means for receiving said selected group of RF signals, said tuner means selecting a particular RF signal from said group of RF signals in response to a second control signal, and converting said particular RF signal to a signal at an intermediate frequency (IF);
control means for generating said first and second control signals for causing said RF switch means to select one of said groups of RF signals and said tuner means to select said particular RF signal;
means, coupled to said control means, for entering data in response to operation by a user;
video processing means coupled to said tuner means for receiving, demodulating and amplifying said IF signal; and
on-screen display means coupled to said control means and said video processor means for generating video signals indicative of characters for display;
memory means having a plurality of areas for storing data related to the tuning of ones of said RF signals which are preferred by a user, each of said areas storing tuning information specific to the RF signals of a respective one of said groups of RF signals received at one of said RF input terminals, each of said area including a plurality of memory locations between first and second limits;
wherein in response to said data entered by said user, said control means sequentially retrieves said tuning data from said memory means in one of a linked mode in which said control means automatically retrieves said tuning data beginning at said first limit of a second one of said areas after having retrieved said tuning data from said memory location at said second limit of said first area, and an unlinked mode in which said control means automatically begins the sequential retrieval of said tuning data from said memory location at said first limit of said first area upon retrieving said tuning data from said memory location at said second limit of said first area, said control means automatically generating said first control signal for selecting the respective one of said RF input terminals which is related to the memory area from which said tuning data is to be retrieved, and said control means generating said second control signal in response to said retrieved tuning data;
said on-screen display means generating said character signals in a first color when said first RF input terminal is selected, and in a second color when said second RF input terminal is selected.

6. A television receiver, comprising:
a plurality of radio frequency (RF) signal input terminals, each of which receives a group of RF signals from respective RF signal sources;
RF switch means having a plurality of inputs, each of which is connected to a respective one of said RF input terminals, said RF switch means having an output at which is developed one of said groups of RF signals selected from said groups of RF signals at said inputs, said RF input switch having a control input for receiving a first control signal for selecting said selected group of RF signals;
tuner means coupled to said RF switch means for receiving said selected group of RF signals, said tuner means selecting a particular RF signal from said group of RF signals in response to a second control signal, and converting said particular RF signal to a signal at an intermediate frequency (IF);
control means for generating said first and second control signals for causing said RF switch means to select one of said group of RF signals and said tuner means to select said particular RF signal;
means, coupled to said control means, for entering data in response to operation by a user;
video processing means coupled to said tuner means for receiving, demodulating and amplifying said IF signal; and
on-screen display means coupled to said control means and said video processor means for generating video signals indicative of characters for display;
memory means having a plurality of areas for storing data related to the tuning of ones of said RF signals which are preferred by a user, each of said areas storing tuning information specific to the RF signals of a respective one of said groups of RF signals received at one of said RF input terminals, each of said area including a plurality of memory locations between first and second limits;
wherein in response to said data entered by said user, said control means sequentially retrieves said tuning data from said memory means in one of a linked mode in which said control means automatically retrieves said tuning data beginning at said first limit of a second one of said areas after having retrieved said tuning data from said memory location at said second limit of said first area, and an unlinked mode in which said control means automatically begins the sequential retrieval of said tuning data from said memory location at said first limit of said first area upon retrieving said tuning data from said memory location at said second limit of said first area, said control means automatically generating said first control signal for selecting the respective one of said RF input terminals which is related to the memory area from which said tuning data is to be retrieved, and said control means generating said second control signal in response to said retrieved tuning data;

said on-screen display means generating said character signals in a first color when said first RF input terminal is selected, and in a second color when said second RF input terminal is selected;

said means for entering data comprises a keyboard including a first key for selecting said first RF input terminal and a second key for selecting said second RF input terminal, said first key for selecting said first RF input terminal being distinguished from said second key for selecting said second RF input terminal by a color associated with said first key.

7. The television receiver of claim 6, wherein one of said first RF input terminal is distinguished from said second RF input terminal by a color associated with said first RF input terminal, and wherein said key for selecting said first RF input terminal and said first RF input terminal are associated with the same color.

8. The television receiver of claim 7 wherein said first RF input terminal, said first key for selecting said first input terminal, and said character signals generated for display when said first RF input terminal is selected, are all associated with the same color.

* * * * *